US006472956B2

(12) United States Patent
Kosuga

(10) Patent No.: US 6,472,956 B2
(45) **Date of Patent: *Oct. 29, 2002**

(54) TUNABLE INPUT TRAP CIRCUIT AND IMAGE TRAP CIRCUIT

(75) Inventor: Tadashi Kosuga, Kawagoe (JP)

(73) Assignee: Pioneer Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/576,817

(22) Filed: May 24, 2000

(65) Prior Publication Data

US 2002/0130735 A1 Sep. 19, 2002

(30) Foreign Application Priority Data

May 25, 1999 (JP) .......................................... 11-145043

(51) Int. Cl.$^{7}$ .................................................. H03H 7/01

(52) U.S. Cl. ........................ 333/174; 333/176; 455/302

(58) Field of Search ................................ 333/174, 175, 333/176; 455/302

(56) References Cited

U.S. PATENT DOCUMENTS 5,065,453 A * 11/1991 Thomas .................. 333/176 X
5,841,329 A * 11/1998 Dutilleul ..................... 333/175

FOREIGN PATENT DOCUMENTS

JP 04-082409 * 3/1992
JP 04-249413 * 9/1992

* cited by examiner

*Primary Examiner*—Justin P. Bettendorf
(74) *Attorney, Agent, or Firm*—Nixon & Vanderhye P.C.

(57) ABSTRACT

An input trap circuit removes a predetermined frequency component included in an input signal and then outputs the input signal to a circuit at a later stage. The input trap circuit is provided with: a parallel oscillation circuit in which a pair of variable capacitance diodes are connected in series such that cathodes thereof are connected to each other at a junction portion and in which an inductance is connected in parallel to the variable capacitance diodes between anodes of the variable capacitance diodes at both ends thereof; a voltage applying device for applying a voltage to the junction portion so as to vary capacitance values of the variable capacitance diodes on the basis of reverse voltage characteristics of the variable capacitance diodes respectively; and a variable capacitor element connected between the junction portion and a ground.

13 Claims, 7 Drawing Sheets

TUNABLE INPUT TRAP CIRCUIT AND IMAGE TRAP CIRCUIT

BACKGROUND OF THE INVENTION

1. Field of the Invention

The present invention generally relates to a trap circuit for removing a disturbance or interference wave, and more particularly to an image trap circuit for removing an image disturbance wave at an input stage such as an FM tuner or the like.

2. Description of the Related Art

In an FM tuner, a front end is constructed such that an image trap circuit for reducing a component of an image disturbance wave is inserted at the input stage, in order to prevent the deterioration of the receiving ability of the FM tuner due to the image disturbance wave corresponding to a desired wave having a predetermined frequency.

In this kind of image trap circuit, a parallel oscillator circuit is constructed such that a coil is connected between anodes of variable capacitance diodes, whose cathodes are connected to each other. A trimmer capacitor is also connected between the anodes of variable capacitance diodes in parallel to the coil. A tuning voltage is applied to the junction portion between the variable capacitance diodes, so that the capacitances of the variable capacitance diodes are varied by controlling this tuning voltage. The image frequency is set in correspondence with an oscillation frequency determined by the coil, the variable capacitance diodes and the trimmer capacitor. In operation, a received signal from an antenna is outputted to a main tuning circuit at the later stage thereof after the component of the image frequency is sufficiently reduced. Thus, it is possible to avoid the deterioration in the receiving ability of the circuit at the later stage due to the image disturbance.

Here, the function of the trimmer capacitor in this kind of image trap circuit is to restrain the variance or fluctuation of the image disturbance characteristic with respect to the tuning voltage, due to the variance in the respective elements. Namely, by finely adjusting the trimmer capacitor in the manufacturing process or the like, the relationship between the tuning voltage and the image frequency is maintained to be constant, so that it is possible to adjust the image disturbance characteristic in correspondence with the control width of the tuning voltage.

In this kind of image trap circuit, it is ideally preferable to give no influence onto a desired wave. However, actually in the frequency range of the desired wave, such a characteristic of having a peak at a certain portion is exhibited, and the passing loss is gradually increased in the range other than the peak. Since this peak is generated due to the characteristic of the above mentioned parallel oscillator circuit, when the trimmer capacitor is adjusted, not only the attenuation characteristic of the image disturbance frequency but also the peak generated in the frequency range of the desired wave is changed. By this, the level in the image trap circuit with respect to the desired wave is changed, so that the variation or irregularity in the receiving sensitivity of the FM tuner is brought about, which is a problem.

SUMMARY OF THE INVENTION

It is therefore an object of the present invention to provide an input trap circuit and an image trap circuit, which can keep the receiving sensitivity appropriate while restraining the level variation with respect to a desired frequency and can remove an unnecessary frequency component such as an image disturbance wave in stable, even if the frequency characteristic of the trap circuit at the input stage is finely adjusted by a variable capacitor element.

The above object of the present invention can be achieved by an input trap circuit for removing a predetermined frequency component included in an input signal and then outputting the input signal to a circuit at a later stage. The input trap circuit is provided with: a parallel oscillation circuit in which a pair of variable capacitance diodes are connected in series such that cathodes thereof are connected to each other at a junction portion and in which an inductance is connected in parallel to the variable capacitance diodes between anodes of the variable capacitance diodes at both ends thereof; a voltage applying device for applying a voltage to the junction portion so as to vary capacitance values of the variable capacitance diodes on the basis of reverse voltage characteristics of the variable capacitance diodes respectively; and a variable capacitor element connected between the junction portion and a ground.

According to the input trap circuit of the present invention, when the input signal is inputted to the input trap circuit, it passes through the parallel oscillation circuit having the pair of variable capacitance diodes and the inductance such as a coil etc., and is outputted to the circuit at the later stage in such a condition that the frequency component corresponding to the oscillation frequency is attenuated. At this time, with respect to the junction portion where the cathodes of the pair of variable capacitance diodes are connected to each other, the predetermined voltage is applied by the voltage applying device, so that the capacitance values are changed on the basis of the reverse voltage characteristics of the variable capacitance diodes. Therefore, it is possible to set a predetermined unnecessary frequency to the oscillation frequency, and thereby remove the unnecessary frequency component easily out of the input signal. On the other hand, by the variable capacitance element connected between the junction portion and the ground, the characteristic for the frequency to be removed can be adjusted. At the time of adjusting it, the characteristic for the frequency other than the frequency to be removed can be kept in stable. Thus, without causing a level change of the input signal, it is possible to adjust the frequency characteristic of the input trap circuit appropriate for removing the above mentioned unnecessary frequency component.

In this manner, according to the present invention, it is possible to provide the input trap circuit, which can easily remove the unnecessary frequency component by controlling the frequency characteristic of the oscillator circuit, and also can adjust the characteristic of the frequency to be removed appropriate by the variable capacitor element without causing the level change in the passing component.

The above object of the present invention can be also achieved by an image trap circuit, which is inserted in an input stage of an FM tuner circuit, for removing an image frequency component included in a received signal and then outputting the received signal to a circuit at a later stage. The image trap circuit is provided with: a parallel oscillation circuit in which a pair of variable capacitance diodes are connected in series such that cathodes thereof are connected to each other at a junction portion and in which an inductance is connected in parallel to the variable capacitance diodes between anodes of the variable capacitance diodes at both ends thereof; a voltage applying device for applying a voltage to the junction portion so as to vary capacitance values of the variable capacitance diodes on the basis of reverse voltage characteristics of the variable capacitance diodes respectively; and a variable capacitor element connected between the junction portion and a ground, wherein a voltage variable range of the voltage applying device is set in correspondence with a frequency band of the image frequency component.

According to the image trap circuit of the present invention, when the received signal is inputted to the FM tuner circuit, it passes through the parallel oscillation circuit having the pair of variable capacitance diodes and the inductance such as a coil etc., and is outputted to the circuit at the later stage in such a condition that the frequency component corresponding to the oscillation frequency is attenuated. At this time, with respect to the junction portion where the cathodes of the pair of variable capacitance diodes are connected to each other, the predetermined voltage is applied by the voltage applying device, so that the capacitance values are changed on the basis of the reverse voltage characteristics of the variable capacitance diodes. Therefore, by setting an image frequency corresponding to the received signal to the oscillation frequency, it is possible to remove the image frequency component easily out of the received signal and thereby improve the image disturbance characteristic easily. On the other hand, by the variable capacitance element connected between the junction portion and the ground, the characteristic for the image frequency can be adjusted. At the time of adjusting it, the characteristic of the frequency of the desired wave can be kept in stable. Thus, without causing a level change of the received signal, it is possible to adjust the image disturbance characteristic of the image trap circuit appropriate while maintaining the receiving sensitivity high.

In this manner, according to the present invention, it is possible to provide the image trap circuit, which can easily remove the image frequency component corresponding to the FM received signal by controlling the frequency characteristic of the oscillator circuit, and also can adjust the removing characteristic for the image frequency appropriate by the variable capacitor element while maintaining the receiving ability high for the FM received signal.

In one aspect of the image trap circuit of the present invention, a mixer circuit included in the FM tuner circuit generates an IF (Intermediate Frequency) signal by use of a local oscillation frequency, which is higher than a frequency of the received signal.

According to this aspect, in the FM tuner circuit, the frequency, which is higher than the of the received signal by the frequency of the IF signal, is set as the local oscillator frequency, and is mixed by the mixer circuit so that the IF signal is generated. Thus, the image disturbance wave is generated at the frequency, which is higher than the local oscillator frequency by the frequency of the IF signal. As a result, the frequency, which is higher than the frequency of the received signal by two times of the frequency of the IF signal, becomes the image frequency. Under such an FM receiving condition in general, it is possible to maintain the receiving sensitivity high and also adjust the image disturbance characteristic appropriate.

In this manner, according to the present invention, it is possible to provide the image trap circuit, which can adjust the removing characteristic for the image frequency appropriate by the variable capacitor element while maintaining the receiving ability high for the FM received signal, even in case that the frequency of the FM received signal is lower and the image frequency is higher than the local oscillation frequency, which is the general frequency relationship in the FM tuner.

The nature, utility, and further features of this invention will be more clearly apparent from the following detailed description with respect to preferred embodiments of the invention when read in conjunction with the accompanying drawings briefly described below.

DETAILED DESCRIPTION OF THE PREFERRED EMBODIMENTS

Referring to the accompanying drawings, an embodiment of the present invention will be now explained. In the present embodiment, the present invention is applied to an image trap circuit included in the front end of an FM tuner circuit.

Figure 1:
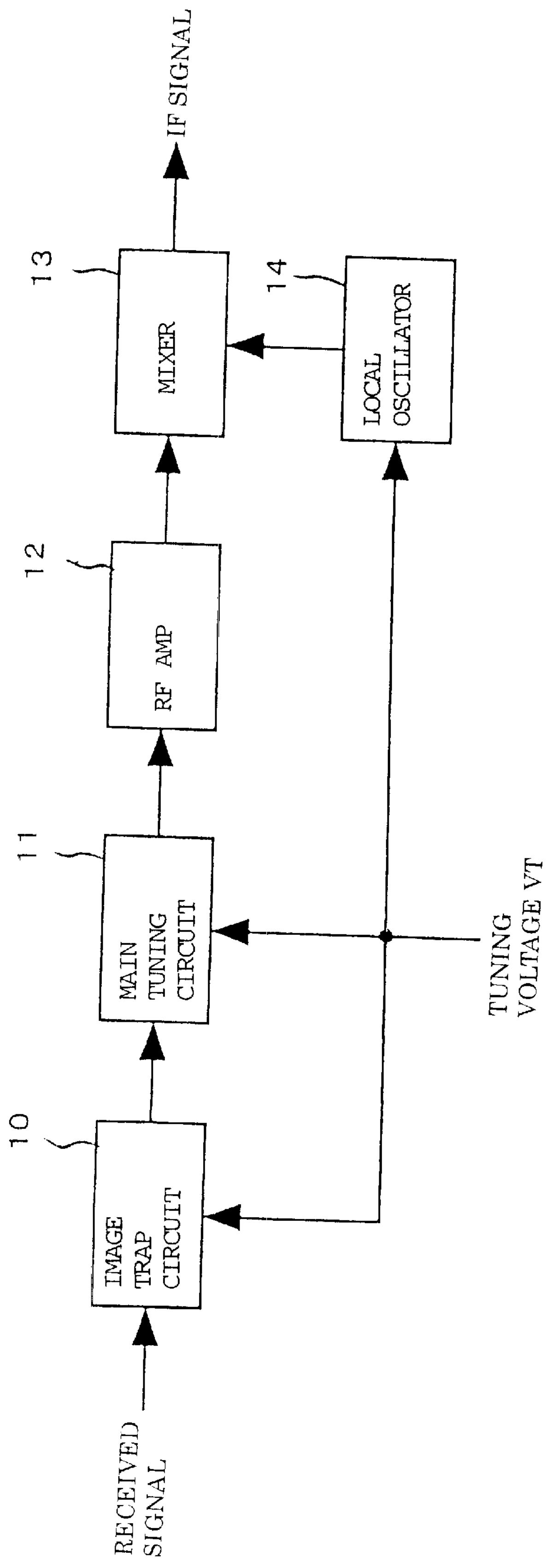
FIG. 1 is a block diagram of a front end of an FM tuner in an embodiment of the present invention.

FIG. 1 is a block diagram showing a construction of the front end of the FM tuner circuit in the present embodiment. As shown in FIG. 1, the front end of the FM tuner circuit is provided with an image trap circuit 10 as an input trap circuit of the present invention, a main tuning circuit 11, an RF (Radio Frequency) amplifier 12, a mixer 13 and a local oscillator 14.

In FIG. 1, a received signal which is received by an antenna is inputted to the image trap circuit 10. This received signal includes a desired wave and an unnecessary disturbance wave corresponding to this desired wave. Among them, only the image disturbance wave is removed on the basis of a later described action by the image trap circuit 10. Then, after the selectivity is improved as the main tuning circuit 11 tunes the frequency range of the desired wave, the received signal is amplified by a predetermined gain by the RF amplifier 12. Then, the amplified received signal is mixed with the local oscillation frequency, which is outputted by the local oscillator 14, by the mixer 13, so that an IF (Intermediate Frequency) signal having a frequency equivalent to the difference between the frequency of the received signal and the local oscillation frequency. For example, the frequency of the IF signal is set to 0.7 MHz.

With respect to the front end shown in FIG. 1, a tuning voltage VT is respectively applied to the image trap circuit 10, the main tuning circuit 11 and the local oscillator 14. Namely, in correspondence with the received frequency selected at the FM tuner, the tuning ranges of the image trap circuit 10 and the main tuning circuit 11 are variable-controlled, and the trap frequency is controlled to be coincident with the image frequency by an adjustment of the variable capacitor element equipped in the image trap circuit 10. Further, the local oscillator 14 is controlled so that the local oscillation frequency and the received frequency are separated from each other by the amount of the IF frequency. In this manner, by controlling the tuning voltage VT, it is possible to variable-controlling appropriately the frequency characteristic of the whole front end in correspondence with the tuning operation.

Incidentally, the adjustment with respect to the trap frequency in the image trap circuit 10 is performed not by use of the tuning voltage VT but by use of a later described variable capacitance diode or trimmer diode, as a variable capacitor element of the present invention. For example, in case of using the variable capacitance diode, it may be adjusted by applying a trap frequency adjusting voltage, which is different from the tuning voltage VT.

Here, the frequency relationship at the front end is explained. The explanation is made here with an assumption that the frequency of the desired wave is set to a lower side (i.e., the lower frequency side) as compared with the local oscillation frequency in the FM tuner of the present embodiment. In this case, following two expressions are effected as for the frequency relationship.

$$Fosc-Fd=Fif$$

$$Fi-Fosc=Fif$$

wherein

Fosc: local oscillation frequency

Fd: frequency of the desired wave

Fi: image frequency

Fif: frequency of the IF signal

In fact, the desired wave and the image disturbance wave spread over a predetermined frequency range, in correspondence to which the local oscillation frequency is changed. Thus, among the frequencies in the above expressions, only the frequency Fif of the IF signal is fixed.

Therefore, in case that the frequency Fif=10.7 MHz for example, it is understood that the frequency, which is higher than the frequency Fd of the desired wave by an amount of 21.4 MHz, corresponds to the image frequency Fi. The image trap circuit 10 of the present embodiment is constructed to remove the frequency component of the above mentioned image frequency Fi and pass the frequency component of the frequency Fd of the desired wave.

Figure 2:
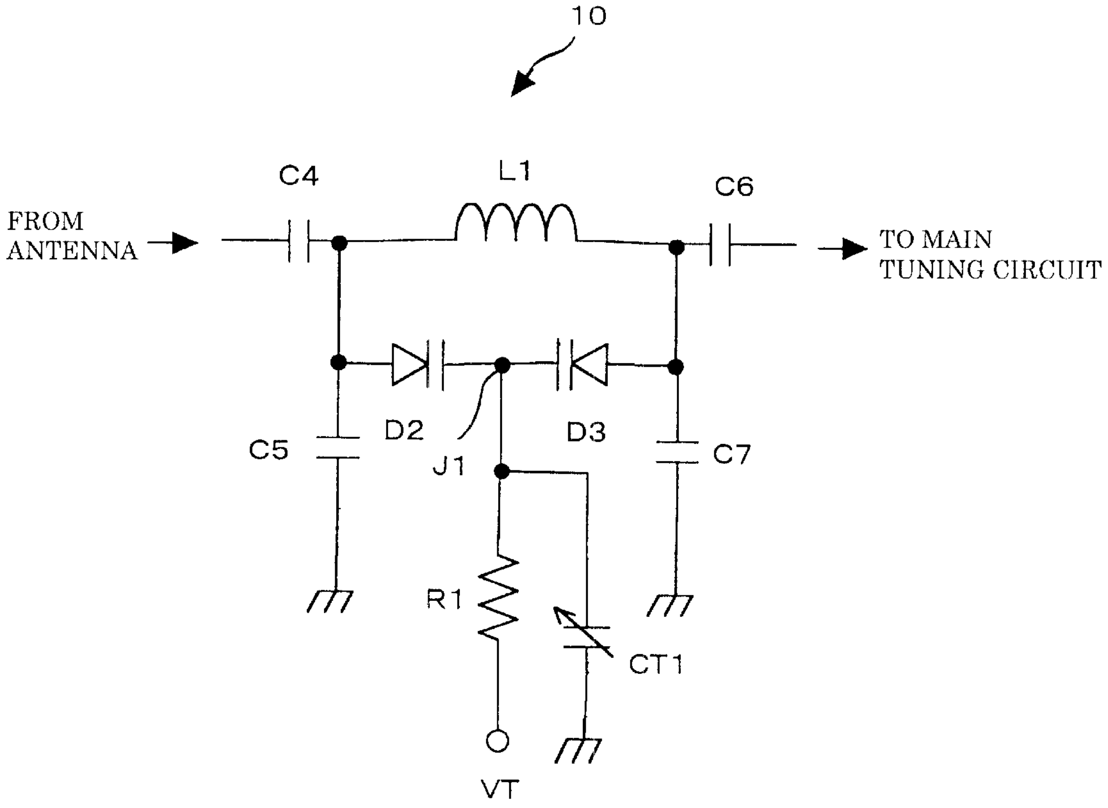
FIG. 2 is a circuit diagram of an image trap circuit in the embodiment.

FIG. 2 is a block diagram showing a circuit construction of the image trap circuit 10 at the front end of the above mentioned FM tuner circuit. The image trap circuit shown in FIG. 2 is provided with a coil L1, capacitors C4, C5, C6 and C7, a resistor R1, a variable capacitance diodes D2 and D3, and a trimmer capacitor CT1 as one example of a variable capacitor element.

In the image trap circuit 10 shown in FIG. 2, the variable capacitance diodes D2 and D3 which are connected in series have the capacitance values based on a reverse voltage vs. capacitance characteristic respectively, and a parallel oscillator circuit is constructed as the coil L1 is connected in parallel between the anodes of both ends of the variable capacitance diodes D2 and D3. Thus, the image trap circuit 10 acts as an input trap circuit for removing the input component corresponding to the oscillation frequency of this parallel oscillator circuit. The variable capacitance diodes D2 and D3 are arranged such that the cathodes thereof are connected to each other at a junction portion J1 and the capacitors C5 and C7 are connected between the anodes thereof and the ground respectively.

At the junction portion J1, the tuning voltage VT is applied through the resistor R1, so that it is possible to variable-control the capacitance values of the variable capacitance diodes D2 and D3 by changing the both end voltages of the variable capacitance diodes D2 and D3 in correspondence with the value of the tuning voltage VT. Normally, as the reverse voltage for each of the variable capacitance diodes D2 and D3 is increased, the capacitance value thereof is decreased. As a result, it is possible to change the oscillation frequency characteristic of the parallel oscillator circuit by the tuning voltage VT, and thereby control appropriately the frequency to be removed at the image trap circuit 10.

The trimmer capacitor CT1 is connected between the junction portion J1 and the ground.

In FIG. 2, in operation, when the received signal which is received from the antenna is inputted, it arrivals at the parallel oscillator circuit through the capacitor C4 for coupling, and the frequency component thereof corresponding to the oscillation frequency determined by the tuning voltage VT and the capacitance of the trimmer capacitor CT1 is drastically attenuated. At this time, if the trimmer capacitor CT1 is set such that the image frequency corresponding to the desired wave is coincident with the above mentioned oscillation frequency, it is possible to drastically attenuate the image frequency component. On the other hand, the desired wave component is not or hardly attenuated, and is outputted to the main tuning circuit 11 at the later stage through the capacitor C6 for coupling.

Here, although it is preferable that the variable width of the trap frequency in the image trap circuit 10 is kept to be as constant as possible, a drift is generated in the corresponding relationship of the frequencies, due to the variance of each element included in the image trap circuit 10. Thus, the trimmer capacitor CT1 is finely adjusted so that the image disturbance characteristic is appropriately set.

At this time, although the frequency characteristic in the vicinity of the image frequency changes on the basis of the above mentioned circuit structure upon adjusting the trimmer capacitor CT1, the present embodiment has such a characteristic that the frequency characteristic in the vicinity of the desired frequency is kept to be stable. By this, it is possible to stabilize the receiving sensitivity of the FM tuner without changing the level of the frequency component of the desired wave. This structure is certainly different form that of the conventional technology, which will be described later in detail.

Figure 3:
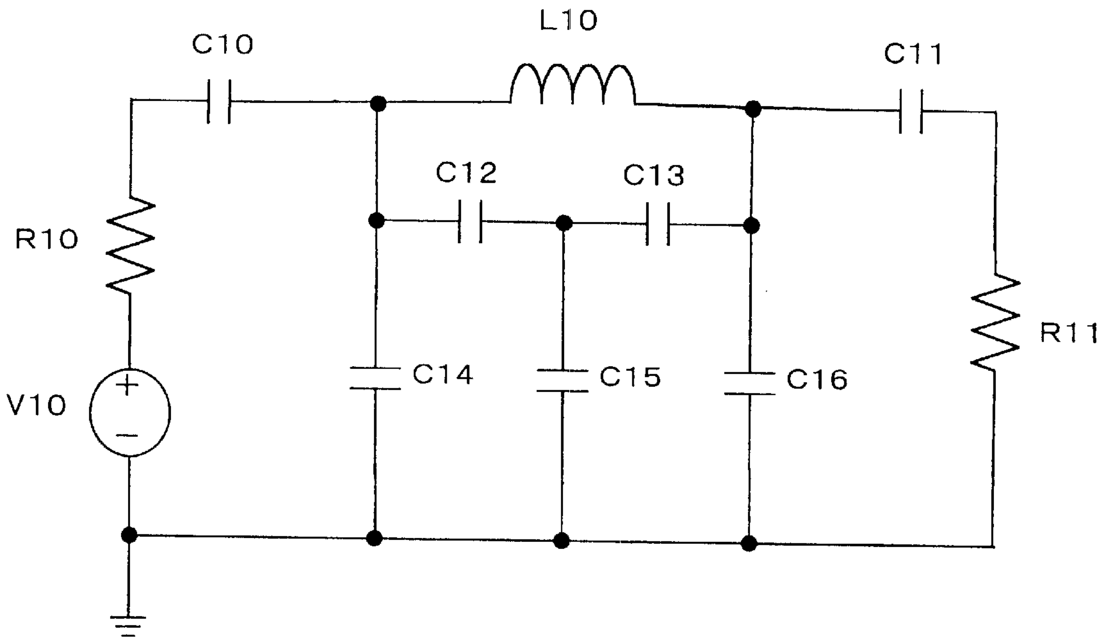
FIG. 3 is a circuit diagram showing an equivalent circuit of the image trap circuit in the embodiment.
Figure 4:
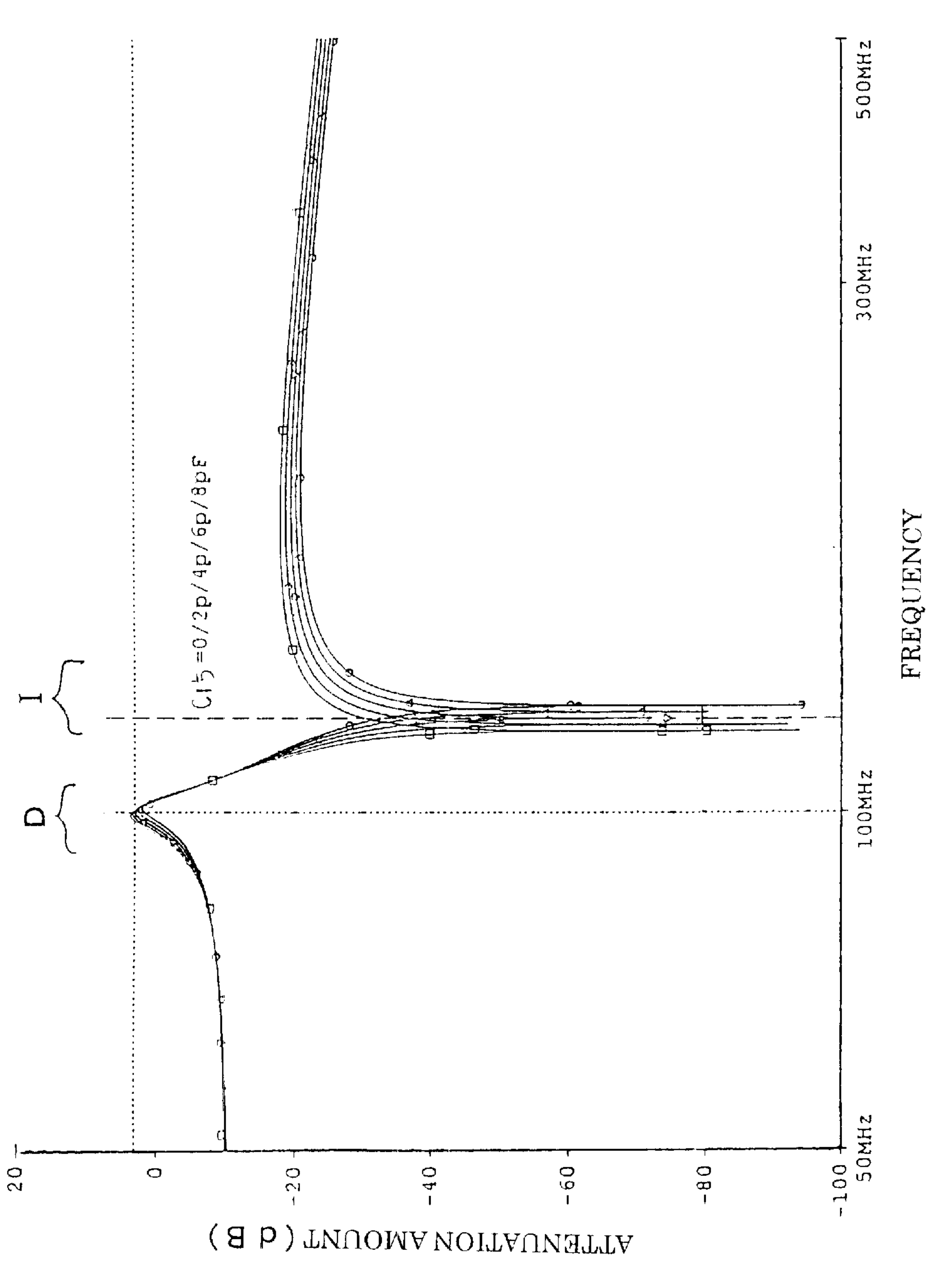
FIG. 4 is a diagram showing a frequency characteristic corresponding to the equivalent circuit of FIG. 3.
Figure 5:
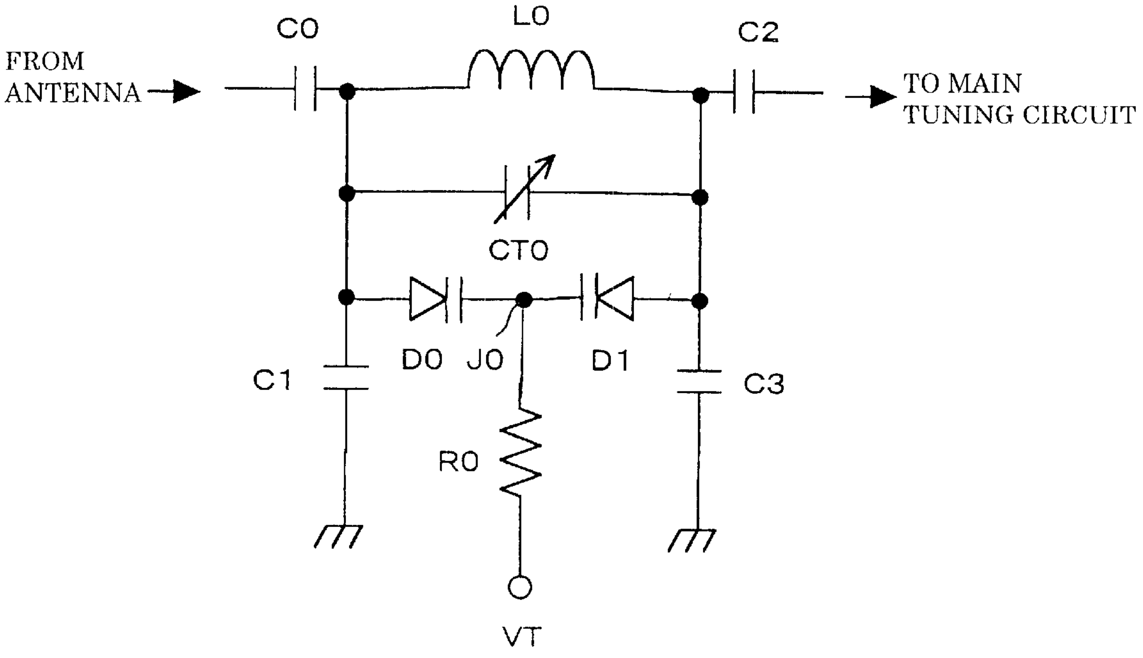
FIG. 5 is a circuit diagram of an image trap circuit in a comparison example.
Figure 6:
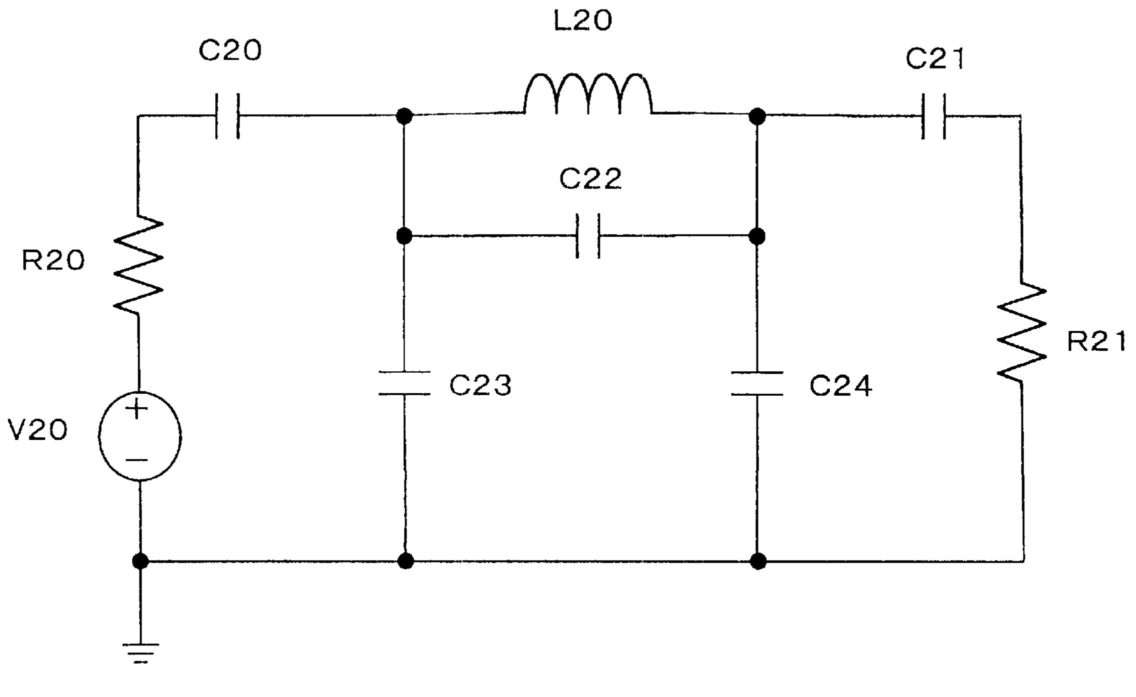
FIG. 6 is a circuit diagram showing an equivalent circuit of the image trap circuit in the comparison example.
Figure 7:
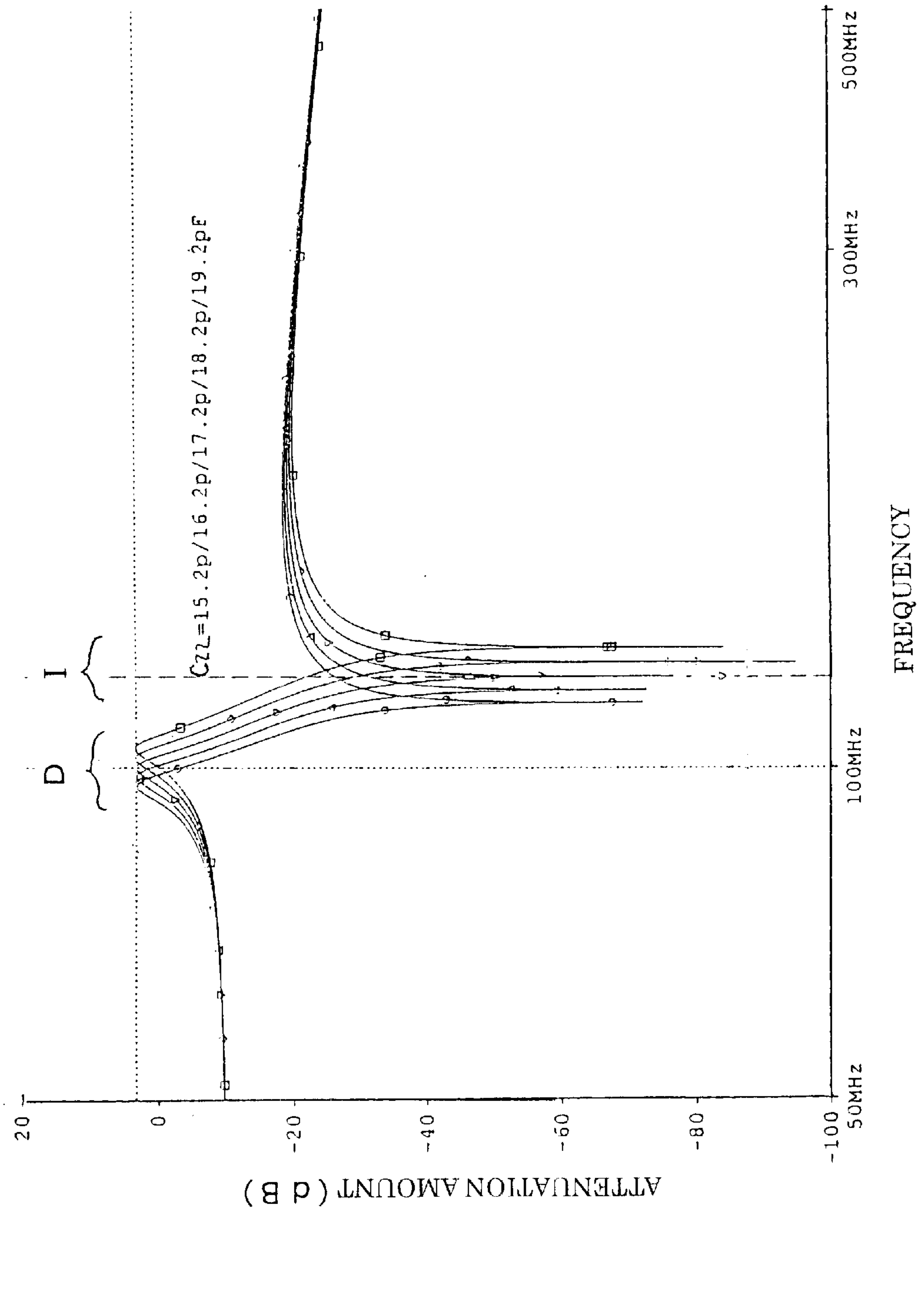
FIG. 7 is a diagram showing a frequency characteristic corresponding to the equivalent circuit of FIG. 6.

Next, the frequency characteristic of the image trap circuit 10 in the present embodiment will be explained with reference to FIG. 3 to FIG. 7. FIG. 3 is a circuit diagram showing an equivalent circuit of the image trap circuit 10 shown in FIG. 2. FIG. 4 is a diagram showing a frequency characteristic obtained by performing a simulation by use of the equivalent circuit of FIG. 3. FIG. 5 is a circuit diagram of an image trap circuit in a comparison example. FIG. 6 is a circuit diagram showing an equivalent circuit of the image trap circuit in the comparison example, and FIG. 7 is a diagram showing a frequency characteristic obtained by performing a simulation by use of the equivalent circuit of FIG. 6.

As shown in FIG. 3, the equivalent circuit of the image trap circuit 10 is provided with capacitors C10, C11, C12, C13, C14, C15 and C16, a coil L10, a resistors R10 and R11 and a signal source V10. Among these, the signal source V10 outputs a high frequency signal having a level and a frequency corresponding to the FM received signal at the antenna, and the resistor R10 represents a signal source resistance. The resistor R10 is assumed to have the resistance of 75Ω, which is the equivalent resistance of the FM antenna. Further, the resistor R11 represents the load resistance.

As comparing FIG. 3 with FIG. 2, the capacitors C10 and C4, the capacitors C11 and C6, the capacitors C14 and C5, the capacitors C16 and C7, the coils L10 and L11 are corresponding to each other respectively. On the other hand, the capacitors C12 and C13 represent the capacitance values of the variable capacitance diodes D2 and D3 when the predetermined voltage VT is applied thereto. Furthermore, the capacitor C15 represents the capacitance value of the trimmer capacitor CT1 to which a predetermined adjustment is applied.

In order to verify the advantageous effect of the image trap circuit 10 in the present embodiment, the comparison example shown in FIG. 5 is constructed such that the arrangement of the trimmer capacitor is different from that of the image trap circuit 10.

Namely, in FIG. 5, the image trap circuit of the comparison example is provided with a coil L0, capacitors C0, C1, C2 and C3, a resistor R0, variable capacitance diodes D0 and D1, and a trimmer capacitor CT0. In the image trap circuit of the comparison example, the variable capacitance diodes D0 and D1 are connected in series, and a parallel oscillator circuit constructed as the coil L0 is connected in parallel between the anodes of both ends of the variable capacitance diodes D0 and D1. The variable capacitance diodes D0 and D1 are arranged such that the cathodes thereof are connected to each other at a junction portion J0 and the capacitors C1 and C3 are connected between the anodes thereof and the ground respectively. At the junction portion J0, the tuning voltage VT is applied through the resistor R0. The trimmer capacitor CT0 is connected in parallel with the coil L0.

As shown in FIG. 6, in contrast to the equivalent circuit shown in FIG. 3, the equivalent circuit of the image trap circuit of the comparison example is provided with capacitors C20, C21, C22, C23 and C24, a coil L20, resistors R20 and R21 and a signal source V20. When comparing this comparison example with the equivalent circuit in FIG. 3, the structure in the vicinity the capacitor C22 is certainly different. This capacitor 22 represents in one body the variable capacitance diodes D0 and D11 connected in series and the trimmer capacitor CT0 shown in FIG. 5.

The frequency characteristic of the attenuation amount from the signal source V10 to the load resistance R11 in the equivalent circuit shown in FIG. 3 changes as shown in FIG. 4. In FIG. 4, the frequency characteristic of the attenuation amount when the capacitor C15 corresponding to the trimmer capacitor CT1 is changed by capacitance values at 5 different stages is indicated. In FIG. 4, the signal frequency is ranged from 50 MHz to 500 MHz, and a distribution range D of the desired frequency and a distribution range I of the image frequency are indicated.

At this time, in the distribution range I of the image frequency, a peak is generated, which corresponds to the attenuation amount of about 80 dB and is directed downward. In the distribution range D of the desired frequency, the peak is generated, whose attenuation amount becomes the minimum. The downward-directed peak in the distribution range I of the image frequency moves along the frequency axis as the capacitance value of the capacitor C15 is changed. On the other hand, the peak in the distribution range D of the desired frequency hardly moves along the frequency axis even if the capacitance value of the capacitor C15 is changed. Therefore, even if the trimmer capacitor CT1 is adjusted, the attenuation amount is kept in stable with respect to the desired wave.

In contrast to this, in case of the equivalent circuit shown in FIG. 6 corresponding to the image trap circuit of the comparison example, as shown in FIG. 7, the frequency characteristic of the attenuation amount when the capacitor C22 is changed by capacitance values at 5 different stages is obtained. In case of FIG. 7, as for the distribution range I of the image frequency, the downward-directed peak in the distribution range I of the image frequency moves along the frequency axis as the capacitance value of the capacitor C22 is changed in the similar manner as that in case of FIG. 4. However, in the distribution range D of the desired frequency hardly, the peak also moves along the frequency axis in correspondence with the change in the capacitance value of the capacitor 22. This is certainly different from that in the case of FIG. 4. Therefore, if the trimmer capacitor CT0 is adjusted, the attenuation amount of the desired wave becomes unstable, so that the variance in the receiving sensitivity is generated at the time of demodulating the FM signal by the circuit at the later stage.

As described above in detail, according to the present embodiment, the image trap circuit 10 can be realized, which can restrain the drift in the frequency characteristic due to the variance of each element by use of a trimmer capacitor CT1 during a manufacturing process or the like upon installing the image trap circuit 10 having a function of passing therethrough the desired wave component included in the received signal from the antenna and removing the image frequency component corresponding to this, and which can adjust the image disturbance characteristic appropriately while keeping the level with respect to the desired wave component in stable. Therefore, by inserting this image trap circuit 10 into the front end of the FM tuner, it is possible to avoid the variance of the received sensitivity along with the adjustment of the image disturbance characteristic.

In the above mentioned embodiment, although the input trap circuit of the present invention is applied to the front end of the FM tuner, the application is not limited to this. It is possible to apply the present invention widely to an input trap circuit for removing an unnecessary signal.

Further, in the above mentioned embodiment, although the case is explained in which the trimmer capacitance is applied as a variable capacitor element of the input trap circuit, the application is not limited to this. Another element can be used as long as it can vary the capacitance. For example, it is possible to use a variable capacitance diode in place of that.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No.11-145043 filed on May 25, 1999 including the specification, claims, drawings and summary is incorporated herein by reference in its entirety.

What is claimed is:

1. An input trap circuit for removing a predetermined frequency component included in an input signal and then outputting the input signal to a circuit at a later stage, said input trap circuit comprising:

a parallel oscillation circuit in which a pair of variable capacitance diodes are connected in series such that cathodes thereof are connected to each other at a junction portion and in which an inductance is connected in parallel to the variable capacitance diodes between anodes of the variable capacitance diodes at both ends thereof;

a voltage applying device for applying a voltage to the junction portion so as to vary capacitance values of the variable capacitance diodes on the basis of reverse voltage characteristics of the variable capacitance diodes respectively; and a variable capacitor element connected between the junction portion and a ground, wherein the variable capacitor element is not connected to the anodes of the variable capacitance diodes.

2. The input trap circuit according to claim 1, wherein said input trap circuit is inserted in an input stage of a tuner, a frequency of the wave to be removed is controlled to be coincident with a frequency of a disturbance wave by an adjustment of a capacitance of said variable capacitor element, and a frequency characteristic of said input stage is controlled and adjusted to a desired frequency of the tuning operation by controlling the voltage applied from said voltage applying device.

3. An image trap circuit, which is inserted in an input stage of an FM tuner circuit, for removing an image frequency component included in a received signal and then outputting the received signal to a circuit at a later stage, said image trap circuit comprising:

a parallel oscillation circuit in which a pair of variable capacitance diodes are connected in series such that cathodes thereof are connected to each other at a junction portion and in which an inductance is connected in parallel to the variable capacitance diodes between anodes of the variable capacitance diodes at both ends thereof;

a voltage applying device for applying a voltage to the junction portion so as to vary capacitance values of the variable capacitance diodes on the basis of reverse voltage characteristics of the variable capacitance diodes respectively; and a variable capacitor element connected between the junction portion and a ground, wherein a voltage variable range of said voltage applying device is set in correspondence with a frequency band of the image frequency component, and the variable capacitor element is not connected to the anodes of the variable capacitance diodes.

4. An image trap circuit according to claim 3, wherein said image trap circuit is installed at the preceding stage with a radio frequency amplifier.

5. An image trap circuit according to claim 3, wherein said variable capacitance element is a trimmer capacitor.

6. An image trap circuit according to claim 3, wherein a mixer circuit included in said FM tuner circuit generates an IF signal by use of a local oscillation frequency, which is higher than a frequency of the received signal.

7. The image trap circuit according to claim 3, wherein a component of the wave to be removed is controlled to be coincident with said image frequency component by an adjustment of a capacitance of said variable capacitor element; and a frequency characteristic of said input stage is controlled and adjusted to a desired frequency of the tuning operation by controlling the voltage applied from said voltage applying device.

8. A trap circuit for removing an undesired component from an input signal having both the undesired component and a desired component, the trap circuit comprising:

an oscillation circuit comprising two variable capacitance diodes connected in series such that the cathodes thereof are connected at a junction portion, and an inductance connected in parallel to the series-connected variable capacitance diodes;

a voltage applying device for applying voltages to the junction portion to vary the capacitances of the variable capacitance diodes; and a variable capacitance element which provides a path from the junction portion to ground that does not pass through the voltage applying device.

9. The trap circuit according to claim 8, wherein the variable capacitance element is not connected to the anodes of the variable capacitance diodes.

10. The trap circuit according to claim 9, wherein said trap circuit is inserted in an input stage of a tuner, said undesired component to be removed is controlled to be coincident with said component of a disturbance wave by an adjustment of a capacitance of said variable capacitor element, and a frequency characteristic of said input stage is controlled and adjusted to a desired frequency of the tuning operation by controlling the voltage applied from said voltage applying device.

11. A trap circuit for removing an undesired component from an input signal having both the undesired component and a desired component, the trap circuit comprising:

an oscillation circuit comprising two variable capacitance diodes connected in series such that the cathodes thereof are connected at a junction portion, and an inductance connected in parallel to the series-connected variable capacitance diodes;

a voltage applying device for applying voltages to the junction portion to vary the capacitances of the variable capacitance diodes; and a variable capacitance element connected between the junction portion and ground, wherein adjustment of the variable capacitance element adjusts the frequency of the undesired component removed by the trap circuit while maintaining the desired component at substantially the same signal level, and the variable capacitance element is not connected to the anodes of the variable capacitance diodes.

12. The trap circuit according to claim 11, wherein the variable capacitance element comprises a trimmer capacitor.

13. The trap circuit according to claim 11, wherein said trap circuit is inserted in an input stage of a tuner, and a frequency characteristic of said input stage is controlled and adjusted to a desired frequency of the tuning operation by controlling the voltage applied from said voltage applying device.

* * * * *